(12) United States Patent
Chang

(10) Patent No.: US 7,230,483 B2
(45) Date of Patent: Jun. 12, 2007

(54) NEGATIVE FEEDBACK SYSTEM WITH AN ERROR COMPENSATION SCHEME

(75) Inventor: Chih-Chiang Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 48 days.

(21) Appl. No.: 11/069,146

(22) Filed: Mar. 1, 2005

(65) Prior Publication Data

US 2006/0197593 A1 Sep. 7, 2006

(51) Int. Cl.
   *H03F 1/36* (2006.01)
(52) U.S. Cl. .................... 330/109; 330/84; 330/293
(58) Field of Classification Search ............... 330/109, 330/85, 291, 293, 84
   See application file for complete search history.

(56) References Cited

U.S. PATENT DOCUMENTS 3,284,620 A * 11/1966 Lerman ..................... 708/830
4,441,084 A * 4/1984 Akagiri et al. ............ 330/149
6,566,946 B2 * 5/2003 Llewellyn .................... 330/69
6,573,791 B2 * 6/2003 Sridhar ....................... 330/109
2004/0041629 A1 3/2004 Bumman et al.

\* cited by examiner

*Primary Examiner*—Benny Lee
*Assistant Examiner*—Alan Wong
(74) *Attorney, Agent, or Firm*—Duane Morris LLP

(57) ABSTRACT

A negative feedback system includes a first summation module for receiving a system input and outputting a first summation output. A first forward module is coupled to the first summation module for receiving the first summation output and outputting a first forward output. A feedback module is coupled to the first summation module for receiving the first forward output and outputting a feedback output to the first summation module, wherein the first summation output equals the system input minus the feedback output. An error compensation module, having a compensation gain, is coupled to the first summation module for receiving the first summation output and outputting an error compensation output. The compensation gain is adjusted to provide the error compensation output with a predetermined value, such that an output error of a system output is substantially eliminated by combining the error compensation output with the first forward output.

19 Claims, 10 Drawing Sheets

NEGATIVE FEEDBACK SYSTEM WITH AN ERROR COMPENSATION SCHEME

BACKGROUND

The present invention relates generally to a negative feedback system, and more particularly to an error compensation scheme for compensating errors occurred in the negative feedback system.

Negative feedback systems are commonly used in engineering systems to maintain a prescribed relationship between a system output and a system input by comparing them and using the difference as a means of control. This type of systems have a stabilizing equilibrium for the system. Even if there is a change of variable within a stable negative feedback system, it will attempt to establish the equilibrium. A conventional negative feedback system is composed of a forward module, feedback module, and summation module. The feedback module and summation module work together define the relationship between the system output and the system input. For example, the feedback module provides a feedback signal back to the summation module which will subtract the feedback signal from the input signal before providing the forward module with an input signal.

However, this conventional system inherently incurs a gain error. This error will be amplified by the forward module before being output from the system. The error can be further amplified if a system has multiple stages of the negative feedback systems, thereby causing an accumulation of errors. In addition, the conventional negative feedback system also provides a non-linear system output since the forward module has a non-linear gain. This also generates a settling time error, due to the finite bandwidth of the forward module.

Desirable in the art of negative feedback system designs are additional designs that provide a linear output with reduced settling errors, without incurring or accumulating errors.

SUMMARY

This invention discloses a negative feedback system with an error compensation scheme. In one embodiment, the negative feedback system includes a first summation module for receiving a system input and outputting a first summation output. A first forward module is coupled to the first summation module for receiving the first summation output and outputting a first forward output. A feedback module is coupled to the first summation module for receiving the first forward output and outputting a feedback output to the first summation module, wherein the first summation output equals the system input minus the feedback output. An error compensation module, having a compensation gain, is coupled to the first summation module for receiving the first summation output and outputting an error compensation output. The compensation gain is adjusted to provide the error compensation output with a predetermined value, such that an output error of a system output is substantially eliminated by combining the error compensation output with the first forward output.

The construction and method of operation of the invention, however, together with additional objects and advantages thereof will be best understood from the following description of specific embodiments when read in connection with the accompanying drawings.

DESCRIPTION

Figure 1A:
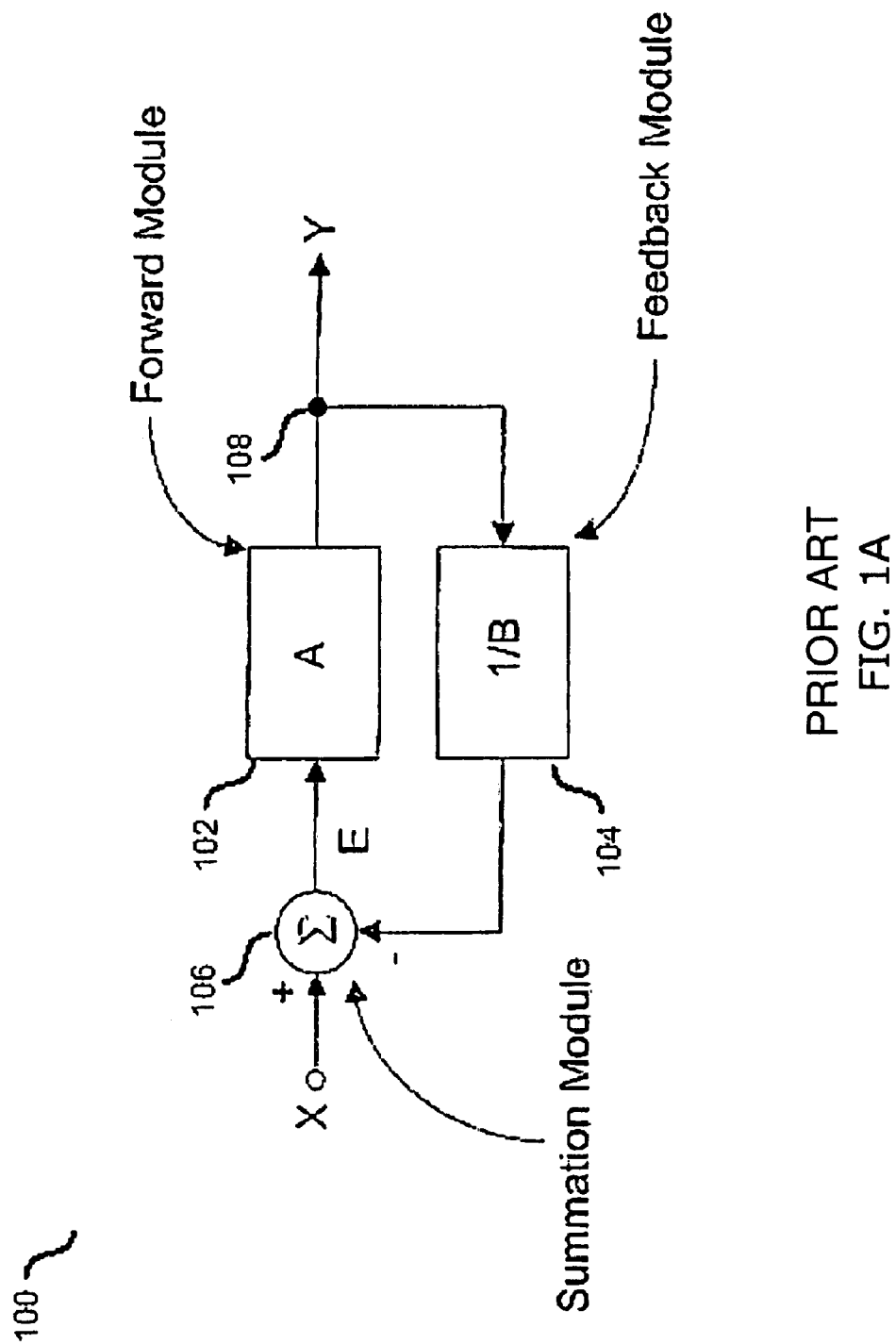
FIG. 1A illustrates a conventional negative feedback system.

FIG. 1A illustrates a conventional negative feedback system 100, which includes a forward module 102, feedback module 104, and summation module 106. The negative feedback system 100 receives an input X and outputs an output Y. The feedback module 104, which has a feedback gain of 1/B, takes the output Y to generate a feedback signal. The summation module 106, which receives the input X, subtracts the feedback signal of the feedback module 104 from the input X. This generates a summation output E at the input of the forward module 102, as described in the following equation:

$$E = X - \frac{Y}{B} \quad (1)$$

The forward module 102 amplifies the summation output E and outputs it to a node 108, which carries the output Y described as the following:

$$Y = AE \quad (2)$$

where A is the gain of the forward module 102.

From equations (1) and (2), the output Y of the negative feedback system 100 can be derived as:

$$Y = BX - BE \quad (3)$$

$$Y = \frac{AB}{A+B} X \quad (4)$$

From equation (3), it is understood that the negative feedback system 100 incurs a gain error of BE. In a system includes a plurality of the conventional negative feedback systems, this error can be further amplified by another stage of the negative feedback system. In addition, since the forward module 102 has a non-linear gain, the output Y generated in the negative feedback system 100 is also non-linear.

Figure 1B:
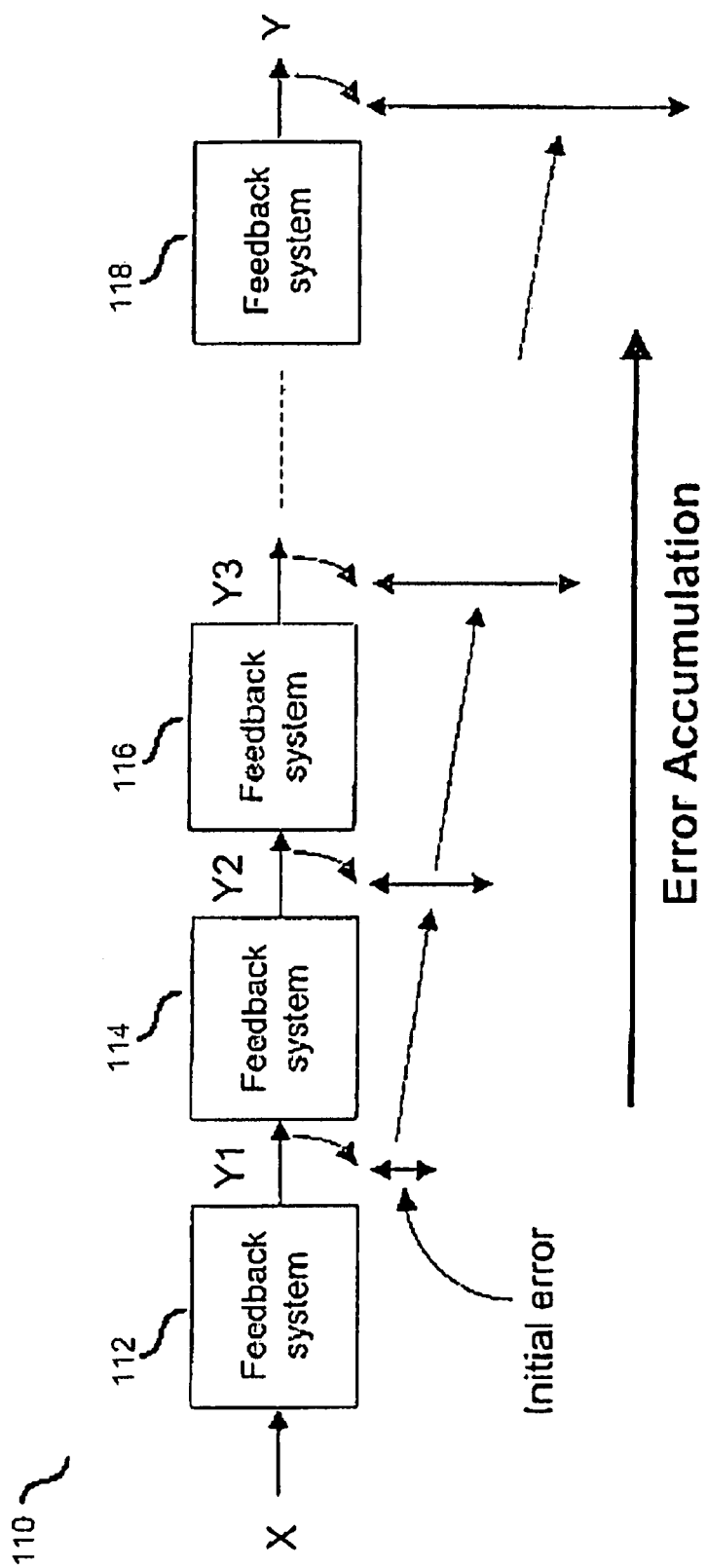
FIG. 1B illustrates a cascaded system including a plurality of conventional negative feedback systems that incur an accumulation of errors.

FIG. 1B schematically illustrates how a cascaded system 110 including a plurality of serially connected conventional negative feedback systems 112, 114, 116, and 118 cause an accumulation and magnification of errors. Each of the negative feedback systems 112, 114, 116, and 118 is identical to the negative feedback system 100 shown in FIG. 1A. Since the negative feedback systems 112, 114, 116, and 118 will have a gain error at its output, error can accumulate after each stage of the cascade system 110.

For example, the output $Y_1$ of the negative feedback system 112 is $B_1X_1-B_1E_1$, where $B_1E_1$ is the initial amplified error signal. The output $Y_1$ will be further amplified by the negative feedback system 114 and be generated as $Y_2$, which equals to $B_1B_2X_1-B_1B_2E_1-B_2E_2$, where $B_1B_2E_1$ and $B_2E_2$ are the accumulated amplified error signal. The amplified error signal of output $Y_2$ is then further accumulated by the negative feedback system 116. The output $Y_3$ of the negative feedback system 116 will be $B_1B_2B_3X_1-B_1B_2B_3E_1-B_1B_2E_2-B_3E_3$, and the accumulated amplified error signal will be $B_1B_2B_3E_1$, $B_1B_2E_2$, and $B_3E_3$ before even reaching the negative feedback system 118. This shows how a large error can accumulate after several stages of negative feedback systems. This accumulated error significantly degrades the performance of the cascaded system 110.

Figure 2:
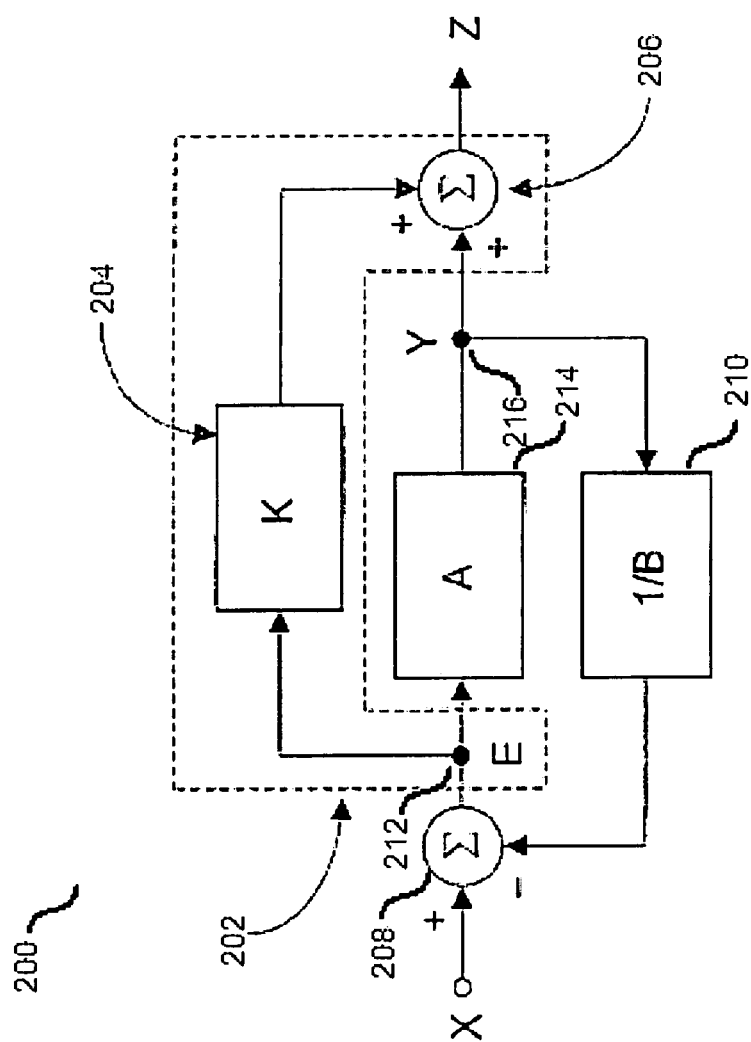
FIG. 2 illustrates a negative feedback system in accordance with one embodiment of the present invention.

FIG. 2 illustrates a negative feedback system 200 in accordance with one embodiment of the present invention. The negative feedback system 200 includes a first summation module 208, first forward module 214, feedback module 210 and error compensation module 202, which further includes a second forward module 204 and second summation module 206. The first summation module 208 receives a system input and outputs a first summation output. The first forward module 214 coupled to the first summation module 208 receives the first summation output and outputs a first forward output. The feedback module 210 coupled to the first summation module 208, in parallel to the first forward module, receives the first forward output and outputs a feedback output to the first summation module 208, wherein the first summation output equals the system input minus the feedback output. The second forward module 204 coupled to the first summation module receives the first summation output and outputs an error compensation output. The second summation module 206 coupled to the first forward module then compensates the forward output with the error compensation output. The operation of the negative feedback system 202 will be explained in details with mathematical equations in the following paragraphs.

When the first summation module 208 receives the system input X and subtracts from it a feedback signal from the feedback module 210, the first summation output E is generated at a node 212 (E=X−(Y/B)). The first forward module 214 amplifies the first summation output and provides the first forward output Y at a node 216. According to equations (3) and (4), the first forward output Y at the node 216 will be derived as (BX−BE) or (A*B*X/(A+B)), where A is the gain of the first forward module 214, 1/B is the gain of the feedback module 210, and BE is the amplified error. The second forward module 204 receives the first summation output E from the node 212 and amplifies it to output the error compensation output to the second summation module 206. The second summation module 206 will take the sum of the first forward output Y and the error compensation output to cancel the error signal. The system output Z can be described as:

$$Z=Y+KE \text{ or} \tag{5}$$

$$Z=BX-BE+KE \text{ or} \tag{6}$$

$$Z = \frac{(A+K)B}{A+B}X \tag{7}$$

where K represents the gain of the second forward module 204.

Adjusting K to approach B can achieve many advantages and improvements. The advantages achieved include, for example, elimination of gain errors, reduction of linearity errors, and improvement of settling time. These advantages will be further discussed in detail with reference to FIGS. 6A, 6B, and 6C.

Figure 3A:
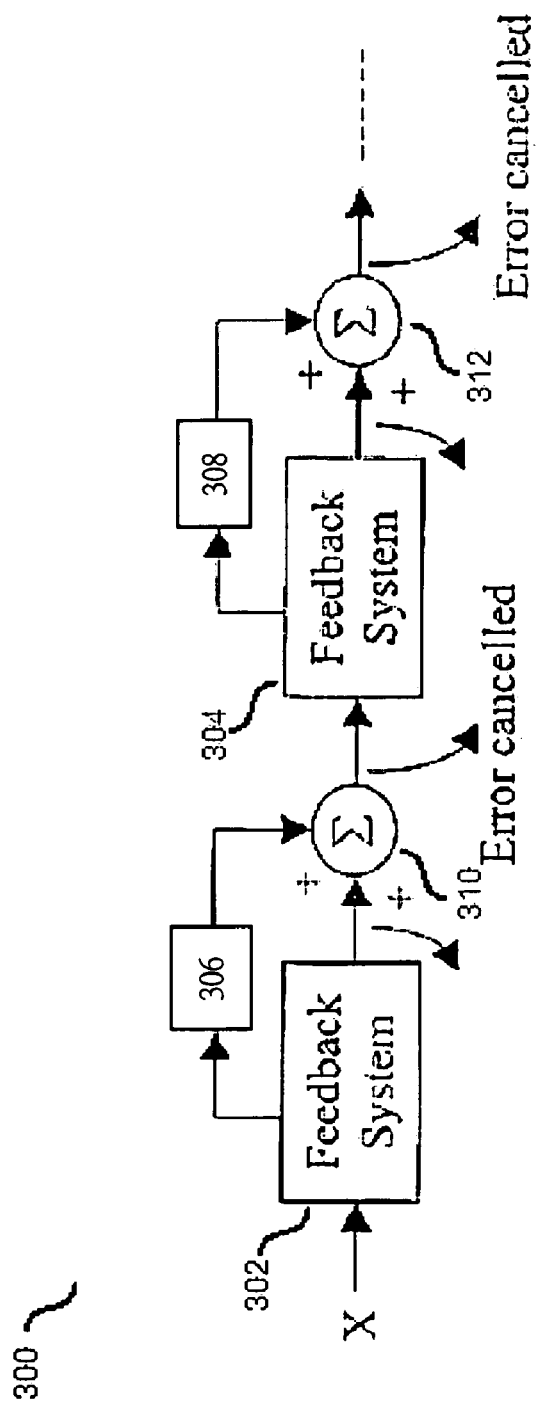
FIG. 3A illustrates a cascaded system using a plurality of the negative feedback systems in accordance with another embodiment of the present invention.

FIG. 3A illustrates a cascaded feedback system 300 in accordance with another embodiment of the present invention. The cascaded feedback system 300 includes a plurality of serially connected negative feedback systems such as negative feedback systems 302 and 304. Both the negative feedback systems 302 and 304 are equivalent to the conventional negative feedback system, except that each thereof is also implemented with an error compensation module much like the error compensation module 202 as shown in FIG. 2A. It is understood that each error compensation module is made of a forward module and a summation module. In this embodiment, the negative feedback system 302 is implemented with an error compensation module having a forward module 306 and a summation module 310, while the negative feedback system 304 is implemented with an error compensation module having a forward module 308 and a summation module 312. It is understood that the combination of the negative feedback system 302, the forward module 306 and the summation module 310 can be seen as an equivalent to the negative feedback system 200, similarly, the combination of the negative feedback system 304, the forward module 308 and the summation module 312 can also be an equivalent to the negative feedback system 200. The two combinations can further be seen as a first feedback stage and a second feedback stage of the cascaded feedback system 300.

Similar to the conventional negative feedback system 100, when the negative feedback system 302 takes in an input X, it will provide an output of an amplified signal that contains an error. The forward module 306 can amplifies the error from the negative feedback system 302. The summation module 310 then takes the sum of the output signal from the negative feedback system 302 with the amplified error from the forward module 306 to cancel the error from the first feedback stage before outputting it to the second feedback stage. Each feedback stage repeats the process, so that no error will accumulate since the errors created by the feedback systems are canceled before the end of each feedback stage.

Figure 3B:
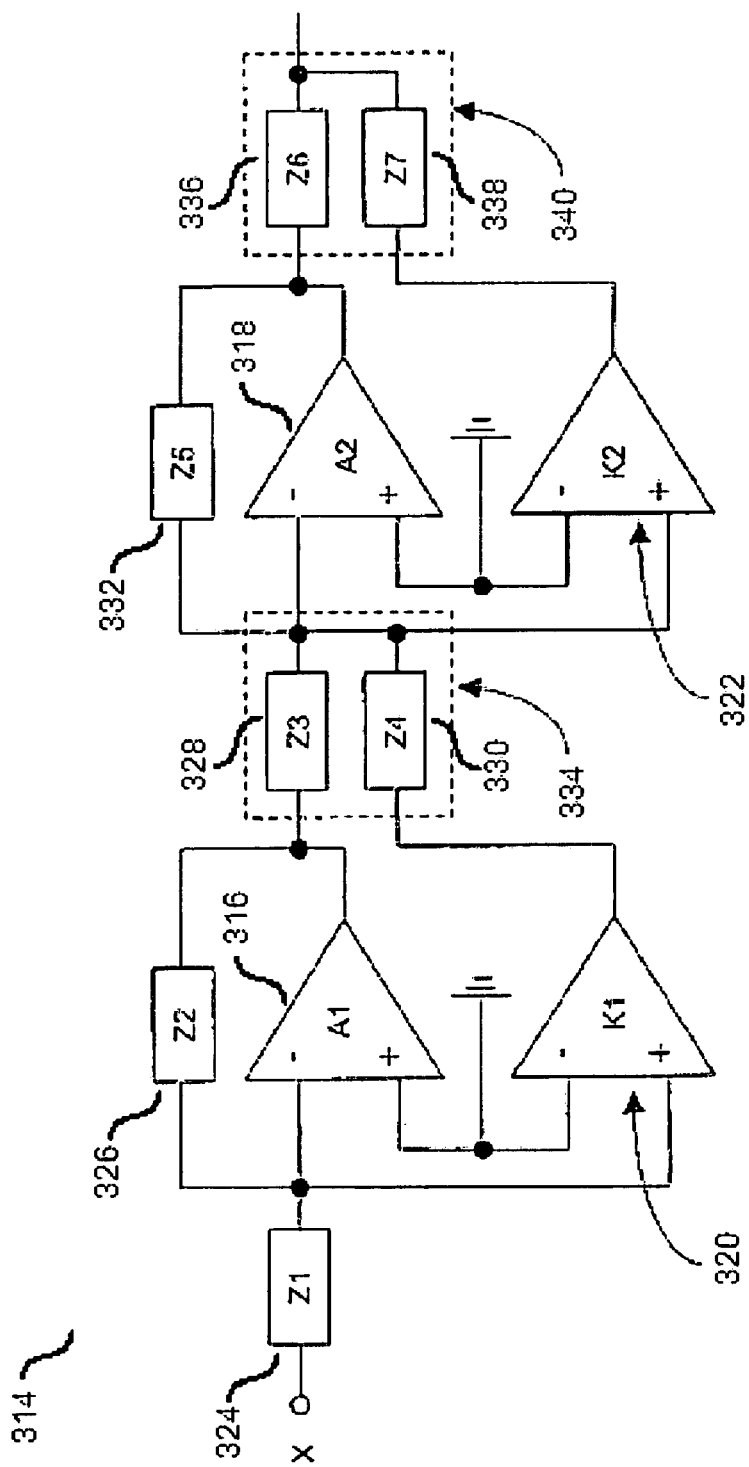
FIG. 3B schematically illustrates a continuous cascade amplifier that uses the negative feedback system in accordance with another embodiment of the present invention.

FIG. 3B schematically illustrates a continuous cascade amplifier 314 in accordance with another embodiment of the present invention. The continuous cascade amplifier 314 includes a plurality of serially connected negative feedback systems. As described above, each of the negative feedback system includes a first summation module, a first forward module, a feedback module, and an error compensation module, which further includes a second forward module and second summation module. The first forward module includes a first amplifier 316 having a first and second input nodes and an output node. The second forward module includes a second amplifier 320 having a first and second input nodes and an output node. The first input node of the second amplifier 320 is connected to the second input node of the first amplifier 316. The feedback module includes a first circuit module 324, having a first impedance Z1, connected to the first input node of the first amplifier 316 and the second input node of the second amplifier 320. The feedback module also includes a second circuit module 326, having a second impedance Z2, connected to the first circuit module 324 in series, and to the first input node and output node of the first amplifier 316 in parallel. The second summation module includes a third circuit module 328, having a third impedance Z3, connected to the second circuit module Z2 and the output node of the first amplifier 316. The second summation module also includes a fourth circuit module 330, having a fourth impedance Z4, connected to the output node of the second amplifier 320, in parallel to the third circuit module 328.

The continuous cascade amplifier 314 is essentially the equivalent circuit implementation of the cascaded feedback system 300 as shown in FIG. 3A. The continuous cascade amplifier 314 includes two feedback stages. Each feedback stage includes a first forward amplifier 316 or 318 and a second forward amplifier 320 or 322. The feedback modules for the two feedback stages are made of circuit modules 324, 326, 328, 330, and 332 where each has device impedance represented by Z1, Z2 . . . Z5. The circuit modules 328 and 330 form a summation module 334 at the output of the first feedback stage, while the circuit modules 336 and 338 together form another summation module 340 at the output of the second feedback stage. The second forward amplifiers 320 and 322 are used to amplify only the error that is going in to the first forward amplifiers 316 and 318. This amplified error is necessary to eliminate the original error at the end of each feedback stage. The summation modules 334 and 340 are used to add the amplified errors to the outputs from the first forward amplifiers 316 and 318 to cancel the error before the signal is sent to the next stage.

The gains, K1 and K2, of the forward amplifiers 320 and 322 can be calculated, where 1/B is the feedback gain of the forward amplifier 316 and 1/B2 is the feedback gain of the forward amplifier 318:

$$K1=(Z4/Z3)*(B1/1)=(Z4/Z3)*((Z1+Z2)/Z1) \quad (8)$$

$$K2=(Z7/Z6)*(B2/1)=(Z7/Z6)*((Z5+(Z3\|Z4))/(Z3\|Z4)) \quad (9)$$

With the error compensation scheme implemented to the continuous cascade amplifier 314 as illustrated in FIG. 3B, the gains K1 and K2 can be adjusted by varying the values of Z1, Z2 . . . Z5 to cancel the error at each feedback stage. As such, no gain error will be accumulated. It is noteworthy that, in this embodiment, the circuit modules can be any type of passive devices, such as resistors.

Figure 4:
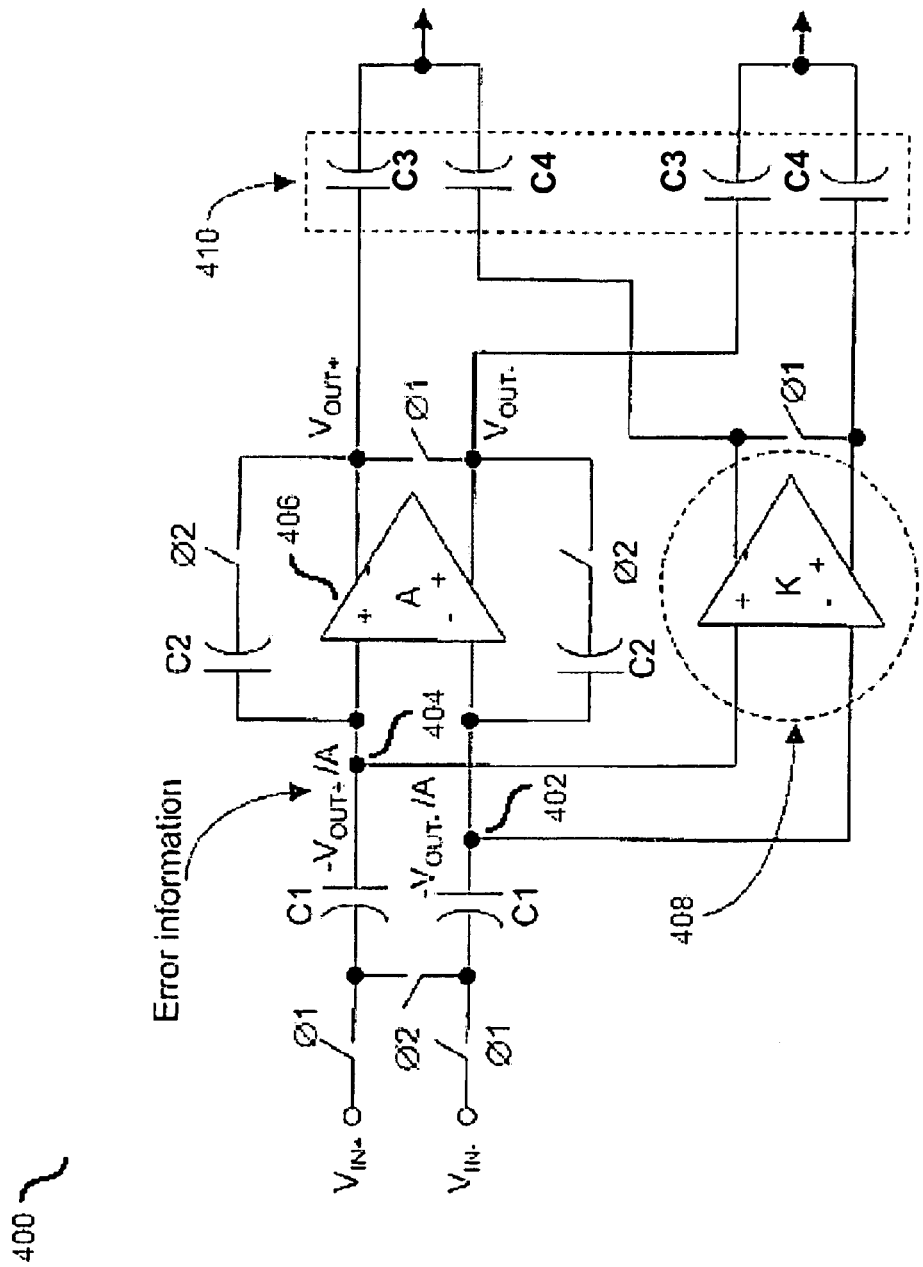
FIG. 4 schematically illustrates the negative feedback system used in a switch capacitor circuit in accordance with another embodiment of the present invention.

FIG. 4 schematically illustrates the negative feedback system 400 used in a fully differential switch capacitor circuit in accordance with another embodiment of the present invention. As described above, the negative feedback system includes a first summation module, a first forward module, a feedback module, and an error compensation module, which further includes a second forward module and second summation module. The first forward module includes a first amplifier 406 having a first and second input nodes and a first and second output nodes. The second forward module includes a second amplifier 408 having a first and second input nodes and a first and second output nodes. The first and second input nodes of the second amplifier 408 are connected to the first and second input nodes of the first amplifier 406, respectively.

The feedback module includes a first capacitor having a capacitance of C1 coupled to the first input node of the first amplifier 406 and the first input node of the second amplifier 408. It also includes a second capacitor having a capacitance of C1 coupled to the second input node of the first amplifier 406 and the second input node of the second amplifier 408. It further includes a third capacitor having a capacitance of C2 coupled between the first input and output nodes of the first amplifier 406, and a fourth capacitor having a capacitance of C2 coupled between the second input and output nodes of the first amplifier 406, in parallel to the same.

The second summation module 410 includes a fifth capacitor having a capacitance of C3 coupled to the first output node of the first amplifier 406, and a sixth capacitor having a capacitance of C4 coupled to the first output node of the second amplifier 408 in parallel to the fifth capacitor. It also includes a seventh capacitor having a capacitance of C3 coupled to the second output node of the first amplifier 406, and a eighth capacitor having a capacitance of C4 coupled to the second output node of the second amplifier 408 in parallel to the seventh capacitor.

The incoming data along with the error information arrive at nodes 402 and 404 before being amplified by a first amplifier 406. The first amplifier 406 then amplifies a signal that includes the data and the error information. The second amplifier 408 is implemented to amplify only the error information from the nodes 402 and 404. With feedback gain of 1/B, forward gain K of the second amplifier 408 is derived by a combination of the capacitors that equals to (C3/C4)*(B/1) or (C3/C4)*((C1+C2)/C2). The summation module 410 comprising four capacitors will take the sum of the data from both the amplifiers 406 and 408. This will eliminate the error information, thereby providing the switched capacitor amplifier 400 with an accurate data sampling with high gain and linear characteristics. It is noteworthy that, in this embodiment, the circuit modules can be any type of passive devices, such as capacitors.

Figure 5:
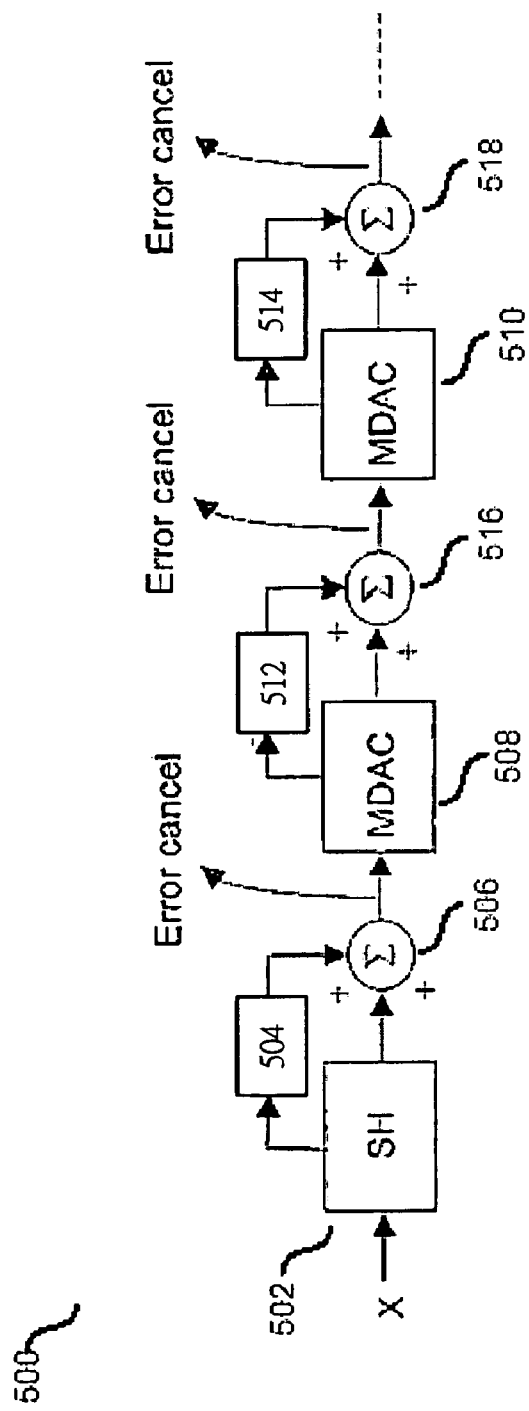
FIG. 5 illustrates a pipelined analog to digital converter using a plurality of the negative feedback systems in accordance with another embodiment of the present invention.

FIG. 5 illustrates a pipelined analog to digital converter (ADC) 500 using a plurality of the negative feedback systems in accordance with another embodiment of the present invention. The error compensation scheme is applied to the pipelined ADC 500. Error accumulation can greatly degrade the performance of a pipelined ADC since an error can also occur and be amplified throughout every stage. The pipelined ADC 500 has broken down to three stages, wherein the first stage contains a sample-and-hold block 502, a compensation module 504, and a summation module 506. The second and third stages are identical, each containing a multiple digital to analog converter (MDAC) 508 or 510, a compensation module 512 or 514, and a summation module 516 or 518. Error can occur in every stage, specifically at the sample-and-hold block 502, the MDAC 508, or the MDAC 510. Compensation modules 504, 512, and 514 are implemented to amplify the same error information at each stage. The amplified error information is then summed together with the output signals of the sample-and-hold block 502, the MDAC 508, or the MDAC 510 such that the error information within the output signal can be canceled and eliminated before passing on to the next stage. By eliminating the possibility of error accumulation, the performance can also be greatly improved.

Figure 6A:
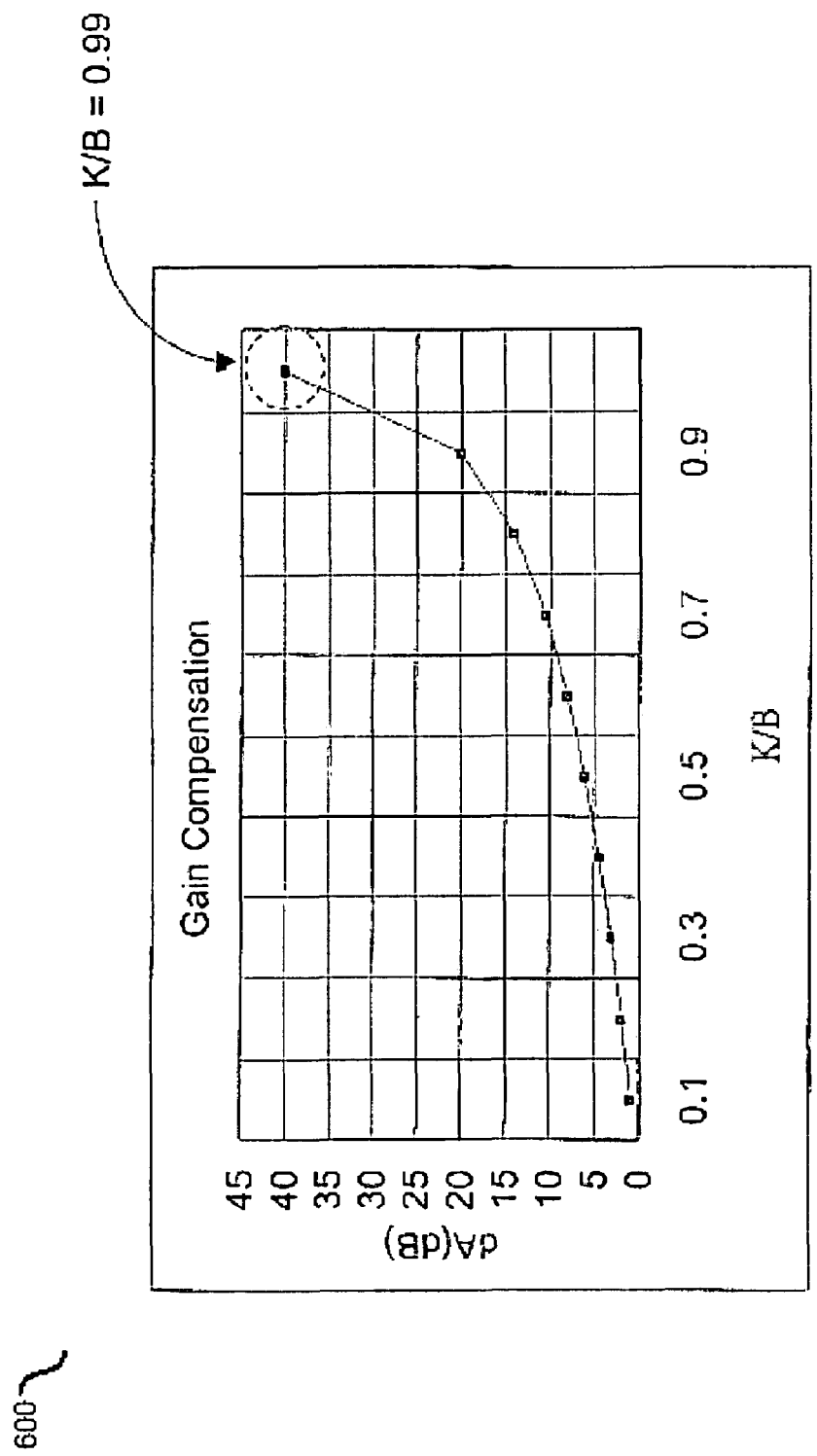
FIG. 6A illustrates a graph showing the gain improvement in accordance the embodiments of the present invention.

FIG. 6A illustrates a graph 600 showing the gain improvement in accordance with the embodiments of the present invention. According to equation (7), the graph 600 shows the gain improvement as a function of K/B ratio, demonstrating that if the forward module of an error compensation module and the feedback module of a negative feedback system have the same gain, where K is equal to B, no gain error will be generated. This also means an infinite gain can be achieved by any negative feedback system implemented with a compensation module. The gain improvement of the proposed negative feedback system over the conventional negative feedback system can be calculated by the following equation:

$$\Delta A(dB) = 20 \log(1/(1-K/B))$$

Figure 6B:
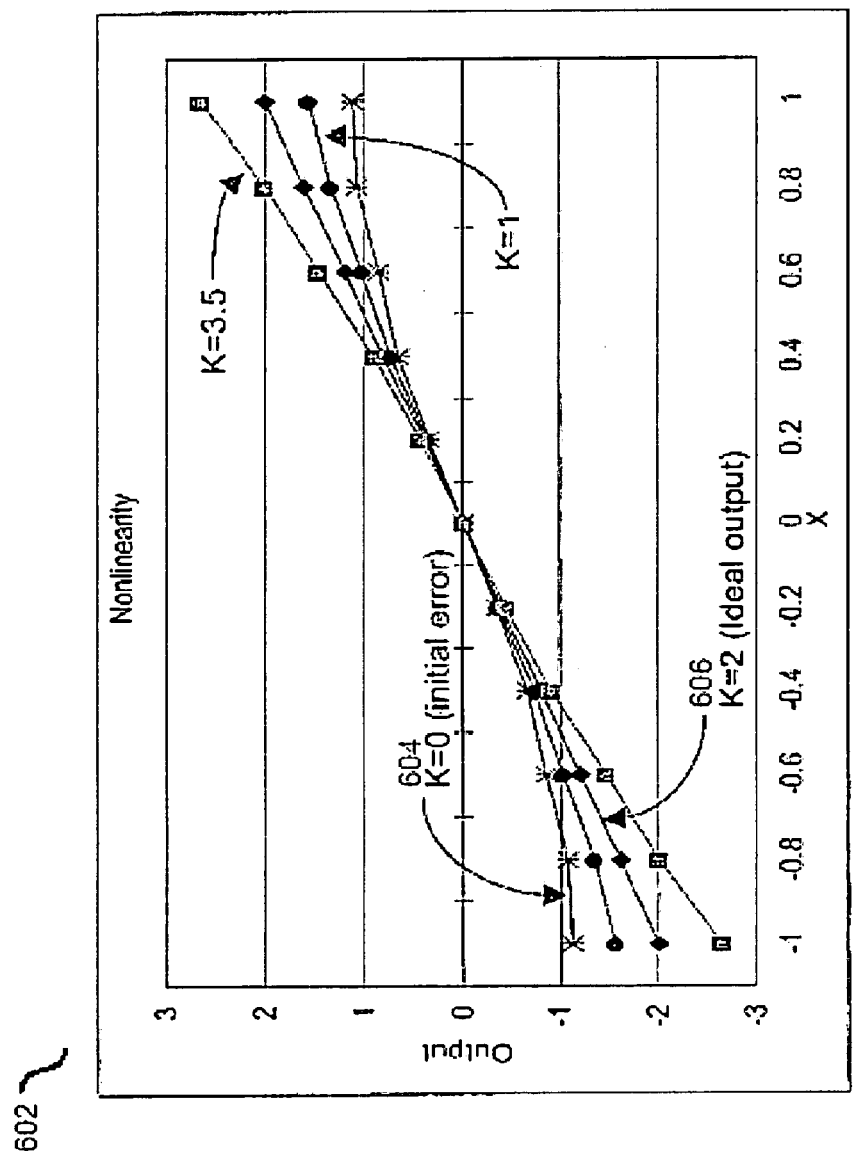
FIG. 6B illustrates a graph showing the linearity improvement in accordance with the embodiments of the present invention.

FIG. 6B illustrates a graph 602 showing the linearity improvement in accordance with the embodiments of the present invention. A graph 602 shows the linearity results for several designs such as a curve 604, which represents the output response of a conventional negative feedback system with no error compensation implemented with forward gain K=0. A curve 606 represents the output response of the negative feedback system in accordance with the embodiments of the present invention. It is shown that the curve 606 exhibits more linearity, when the feedback gain is 2, and the forward gain K is 2.

Figure 6C:
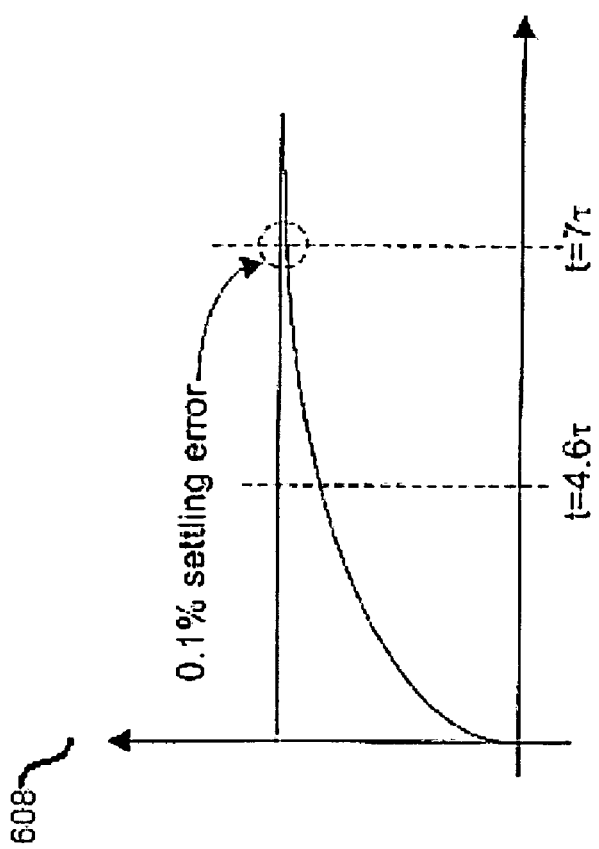
FIG. 6C illustrates another graph showing the settling time improvement in accordance with the embodiments of the present invention.

FIG. 6C illustrates another graph 608 showing the settling time improvement in accordance with the embodiments of the present invention. A settling error is generated in a negative feedback system with slower speed or narrow bandwidth. Assuming the negative feedback system is a first-order system, the optimal gain of the error compensation forward module will eliminate the settling error of the negative feedback system with slower speed. This optimal gain can be calculated, when $$K = \frac{Ae^{-t/\tau}}{(1-e^{-t/\tau})} + \frac{B}{(1-e^{-t/\tau})} \quad (10)$$

where K is the compensation gain, A is a forward gain of the first forward module, 1/B is the feedback gain, 1/τ is a bandwidth of the negative feedback system, and t is time.

The graph 608 shows that the accuracy of 0.1% settling error is achieved at certain time (t=7*τ) without an error compensation module. No such settling error can be achieved at time t=4.6*τ with an optimized error compensation module gain K according to equation (10). This demonstrates how no settling error will be generated when error compensation module releases the necessary bandwidth requirements for settling accuracy.

This invention provides methods for implementing an error compensation module to a negative feedback system that can cancel the error information before the data outputs the system. By adding a forward module and a summation module, the error information can be separately amplified and returned to the system to cancel the error before being outputted. By implementing this error compensation method, negative feedback systems will have a linear output with no gain error as well as reduction on settling errors. Since the error information is canceled before outputting a negative feedback system, a main system with multiple stages of negative feedback systems will not accumulate any error, thereby allowing it to operate without performance degradation.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A negative feedback system with an error compensation scheme, comprising:
   a first summation module for receiving a system input and outputting a first summation output;
   a first forward module coupled to the first summation module for receiving the first summation output and outputting a first forward output;
   a feedback module coupled to the first summation module for receivivg the first forward output and outputting a feedback output to the first summation module, wherein the first summation output equals the system input minus the feedback output; and
   an error compensation module, having a compensation gain, coupled to the first summation module for receiving the first summation output and outputting an error compensation output,
   wherein the compensation gain is adjusted to provide the error compensation output with a predetermined value, such that an output error of a system output is substantially eliminated by combining the error compensation output with the first forward output, and the compensation gain is determined by at least one predetermined passive device constructing the feedback module.

2. The negative feedback system of claim 1 wherein the error compensation module comprises a second forward module having the compensation gain for amplifying the first summation output wherein the error compensation output equals the first summation output times the compensation gain.

3. The negative feedback system of claim 2 wherein the error compensation module comprises a second summation module for adding the error compensation output to the first forward output as the system output.

4. The negative feedback system of claim 3 wherein the feedback module has a feedback gain, wherein the feedback output equals the first forward output multiplied by the feedback gain.

5. The negative feedback system of claim 4 wherein the compensation gain is adjusted to approach the same value as the feedback gain for substantially eliminating the output error of the system output.

6. The negative feedback system of claim 5 wherein a settling error of the negative feedback system is reduced, when $$K = \frac{Ae^{-t/\tau}}{(1-e^{-t/\tau})} + \frac{B}{(1-e^{-t/\tau})}$$

where K is the compensation gain, A is a forward gain of the first forward module, 1/B is the feedback gain 1/τ is a bandwidth of the negative feedback system, and t is time.

7. A continuous cascade amplifier having a plurality of serially connected negative feedback systems, each of the negative feedback system comprising;
   a first summation module for receiving a system input and outputting a first summation output;
   a first forward module coupled to the first summation module for receiving the first summation output and outputting a first forward output;
   a feedback module coupled to the first summation module for receiving the first forward output and outputting a feedback output to the first summation module, wherein the first summation output equals the system input minus the feedback output; and
   an error compensation module, having a compensation gain, coupled to the first summation module for receiving the first summation output and outputting an error compensation output,
   wherein the compensation gain is determined by at least one predetermined resistor constructing the feedback system to provide the error compensation output with a predetermined value, such that an output error of a system output is substantially eliminated by combining the error compensation output with the first forward output.

8. The continuous cascade amplifier of claim 7 wherein the error compensation module comprises a second forward module having the compensation gain for amplifying the first summation output, wherein the error compensation output equals the first summation output times the compensation gain.

9. The continuous cascade amplifier of claim 8 wherein the error compensation module comprises a second summation module for adding the error compensation output to the first forward output as the system output.

10. The continuous cascade amplifier of claim 9 wherein the first forward module includes a first amplifier having a first and second input nodes and an output node.

11. The continuous cascade amplifier of claim 10 wherein the second forward module includes a second amplifier having a first and second input nodes and an output node, the first input node of the second amplifier being connected to the second input node of the first amplifier.

12. The continuous cascade amplifier of claim 11 wherein the feedback module comprises:
   a first circuit module, having a first impedance, connected to the first input node of the first amplifier and the second input node of the second amplifier; and
   a second circuit module, having a second impedance, connected to the first circuit module in series, and to the first input node and the output node of the first amplifier in parallel.

13. A negative feedback system used in a switch capacitor circuit, comprising:
   a first summation module for receiving a system input and outputting a first summation output;
   a first forward module coupled to the first summation module for receiving the first summation output and outputting a first forward output;
   a feedback module coupled to the first summation module for receiving the first forward output and outputting a feedback output to the first summation module, wherein the first summation output equals the system input minus the feedback output;
   a second forward module, coupled to the first summation module for receiving the first summation output and outputting an error compensation output the second forward module having a compensation gain for amplifying the first summation output, wherein the error compensation output equals the first summation output times the compensation gain; and
   a second summation module, coupled to the first forward module and the second forward module for adding the error compensation output to the first forward output as a system output,
   wherein the compensation gain is determined by at least one predetermined capacitor constructing the feedback system to provide the error compensation output with a predetermined value, such that an output error of a system output is substantially eliminated by combining the error compensation output with the first forward output.

14. The negative feedback system of claim 13 wherein the feedback module has a feedback gain, wherein the feedback output equals the first forward output multiplied by the feedback gain.

15. The negative feedback system of claim 14 wherein the compensation gain is adjusted to approach the same value as the feedback gain for substantially eliminating the output error of the system output.

16. The negative feedback system of claim 13 wherein the first forward module includes a first amplifier having a first and second input nodes and a first and second output nodes.

17. The negative feedback system of claim 16 wherein the second forward module includes a second amplifier having a first and second input nodes and a first and second output nodes, the first and second input nodes of the second amplifier being connected to the first and second input nodes of the first amplifier, respectively.

18. The negative feedback system of claim 17 wherein the feedback module comprises:
   a first capacitor coupled to the first input node of the first amplifier and the first input node of the second amplifier; and
   a second capacitor coupled to the second input node of the first amplifier and the second input node of the second amplifier.

19. The negative feedback system of claim 18 wherein the feedback module comprises:
   a third capacitor coupled between the first input and output nodes of the first amplifier, in parallel to the same; and
   a fourth capacitor coupled between the second input and output nodes of the first amplifier, in parallel to the same.

* * * * *

UNITED STATES PATENT AND TRADEMARK OFFICE
CERTIFICATE OF CORRECTION

| | | |
|---|---|---|
| PATENT NO. | : 7,230,483 B2 | Page 1 of 1 |
| APPLICATION NO. | : 11/069146 | |
| DATED | : June 12, 2007 | |
| INVENTOR(S) | : Chih-Chiang Chang | |

It is certified that error appears in the above-identified patent and that said Letters Patent is hereby corrected as shown below:

Column 8, line 26, delete "receivivg" and insert therefore -- receiving -- .

Column 8, line 44, delete "output" and insert therefore -- output, -- .

Column 9, line 6, delete "comprising;" and insert therefore -- comprising: -- .

Signed and Sealed this

Twenty-seventh Day of November, 2007

JON W. DUDAS
*Director of the United States Patent and Trademark Office*